(12) United States Patent
Shi et al.

(10) Patent No.: US 11,398,446 B2
(45) Date of Patent: Jul. 26, 2022

(54) METHOD AND MATERIAL FOR ATTACHING A CHIP TO A SUBMOUNT

(71) Applicant: Lumentum Operations LLC, San Jose, CA (US)

(72) Inventors: Zhengwei Shi, Houston, TX (US); Lijun Zhu, Dublin, CA (US); Jihua Du, Santa Clara, CA (US)

(73) Assignee: Lumentum Operations LLC, San Jose, CA (US)

(*) Notice: Subject to any disclaimer, the term of this patent is extended or adjusted under 35 U.S.C. 154(b) by 0 days.

(21) Appl. No.: 16/815,659

(22) Filed: Mar. 11, 2020

(65) Prior Publication Data

US 2021/0082859 A1 Mar. 18, 2021

Related U.S. Application Data

(60) Provisional application No. 62/901,178, filed on Sep. 16, 2019.

(51) Int. Cl.
*B29C 35/08* (2006.01)
*H01L 23/00* (2006.01)

(52) U.S. Cl.
CPC .......... *H01L 24/29* (2013.01); *B29C 35/0805* (2013.01); *B29C 2035/0827* (2013.01); *H01L 2224/32245* (2013.01); *H01L 2224/8384* (2013.01)

(58) Field of Classification Search
CPC ... H01L 2224/8384; H01L 2224/32245; B29C 2035/0827
See application file for complete search history.

(56) References Cited

U.S. PATENT DOCUMENTS

| 2010/0123258 A1* | 5/2010 | Yim | H05K 3/323 |
| | | | 257/783 |
| 2011/0290863 A1* | 12/2011 | Kajiwara | B23K 1/206 |
| | | | 228/227 |
| 2017/0267899 A1* | 9/2017 | Brodd | H01B 13/0036 |

OTHER PUBLICATIONS

Buttay, Cyril, "Die Attach of Power Devices Using Silver Sintering—Bonding Process Optimization and Characterization," Universite de Lyon, France and University of Nottingham, United Kingdom, Feb. 21, 2012, 8 pages.
Bhatkal, Ravi.M, "DOE Advanced Materials Panel High Operating Temperature Interconnects for LED Applications," Alpha, an Alent plc Company, 21 pages.
Jin, Howard (Hwail), "High Thermal Conductive Die Attach Paste Using Polymer and Micron Size Silver for Power Semiconductor Package," Alpha Advanced Materials, 6 pages, Suwanee, GA.
"Loctite Ablestik ABP 8068TB," Henkel, May 2018, 3 pages.

(Continued)

*Primary Examiner* — Dale E Page
*Assistant Examiner* — Wilner Jean Baptiste
(74) *Attorney, Agent, or Firm* — Harrity & Harrity, LLP

(57) ABSTRACT

A die attachment material may include an ultra-violet (UV) curable resin and silver particles to attach a chip to a submount, where the silver particles are positioned within the UV curable resin. A method may include heating the die attachment material to obtain the UV curable resin on sintered silver particles, where at least a portion of the die attachment material is position between a chip and a submount. The method may further include irradiating, with UV light, the UV curable resin to obtain a polymer on the sintered silver particles. The polymer may form a layer on the sintered silver particles.

18 Claims, 3 Drawing Sheets

(56) References Cited

OTHER PUBLICATIONS

"Loctite Ablestik SSP 2020," Henkel, Jul. 2015, 2 pages.
"mAgic Sinter Pastes for high performance applications," Heraeus Electronics, 4 pages.
Kim, Namjee, "Pressureless Silver Nanopowder Sintered Bond for Liquid Cooled IGBT Power Module for EVs and HEVs," University of Toronto, 2018, 85 pages.
Chen, Sihai, "Pressure-Less Silver Sintering Pastes for Low Porosity Joint and Large Area Die," Indium Corporation, Clinton, NY, 9 pages.
Chen, Fen, "Pressureless Sintering of Nano-Ag Paste with Low Porosity for High Power Die Attach," PCIM Asia, 2015, 10 pages.
"Silver sintering paste," Kyocera, 4 pages.
"Lead-free die attach materials that offer simplified processing, robust reliability and best-in-class thermal and electrical performance for high power density semiconductor packages," Henkel, 11 pages.
"UV Cure RTV Silicone Rubbers," Shin-Etsu Silicone, 20 pages.

* cited by examiner

US 11,398,446 B2

METHOD AND MATERIAL FOR ATTACHING A CHIP TO A SUBMOUNT

RELATED APPLICATION

This application claims priority under 35 U.S.C. § 119 to U.S. Provisional Patent Application No. 62/901,178 for "SINTERING PASTE WITH HEAT SINK AND CORROSION RESISTANCE PROPERTIES," filed on Sep. 16, 2019, the content of which is incorporated by reference herein in its entirety.

TECHNICAL FIELD

The present disclosure relates generally to sintering materials and to methods and materials for attaching a chip to a submount.

BACKGROUND

Die-attach (DA) materials may be used to assemble components of a device. For example, DA materials may be used to attach one component to another component. DA materials may include DA pastes, DA films, solder pastes, and/or the like.

SUMMARY

According to some implementations, a method may include heating a material including silver particles within an ultra-violet (UV) curable resin to obtain the UV curable resin on sintered silver particles, wherein at least a portion of the material is positioned between a chip and a submount; and irradiating, with UV light, the UV curable resin to obtain a polymer on the sintered silver particles.

According to some implementations, a device may include a submount; a material including a polymer on sintered silver particles, wherein the polymer is formed by curing an ultra-violet (UV) curable resin on the sintered silver particles, and wherein the sintered silver particles are sintered within the UV curable resin; and a chip attached to the submount by the material.

According to some implementations, a die attachment material may include: sintered silver particles to attach a chip to a submount; and a polymer on the sintered silver particles, wherein the polymer is formed by curing an ultra-violet (UV) curable resin on the sintered silver particles, and wherein the sintered silver particles are sintered within the UV curable resin.

According to some implementations, a die attachment material may include: an ultra-violet (UV) curable resin; and silver particles to attach a chip to a submount, wherein the silver particles are positioned within the UV curable resin.

DETAILED DESCRIPTION

Figure 1:
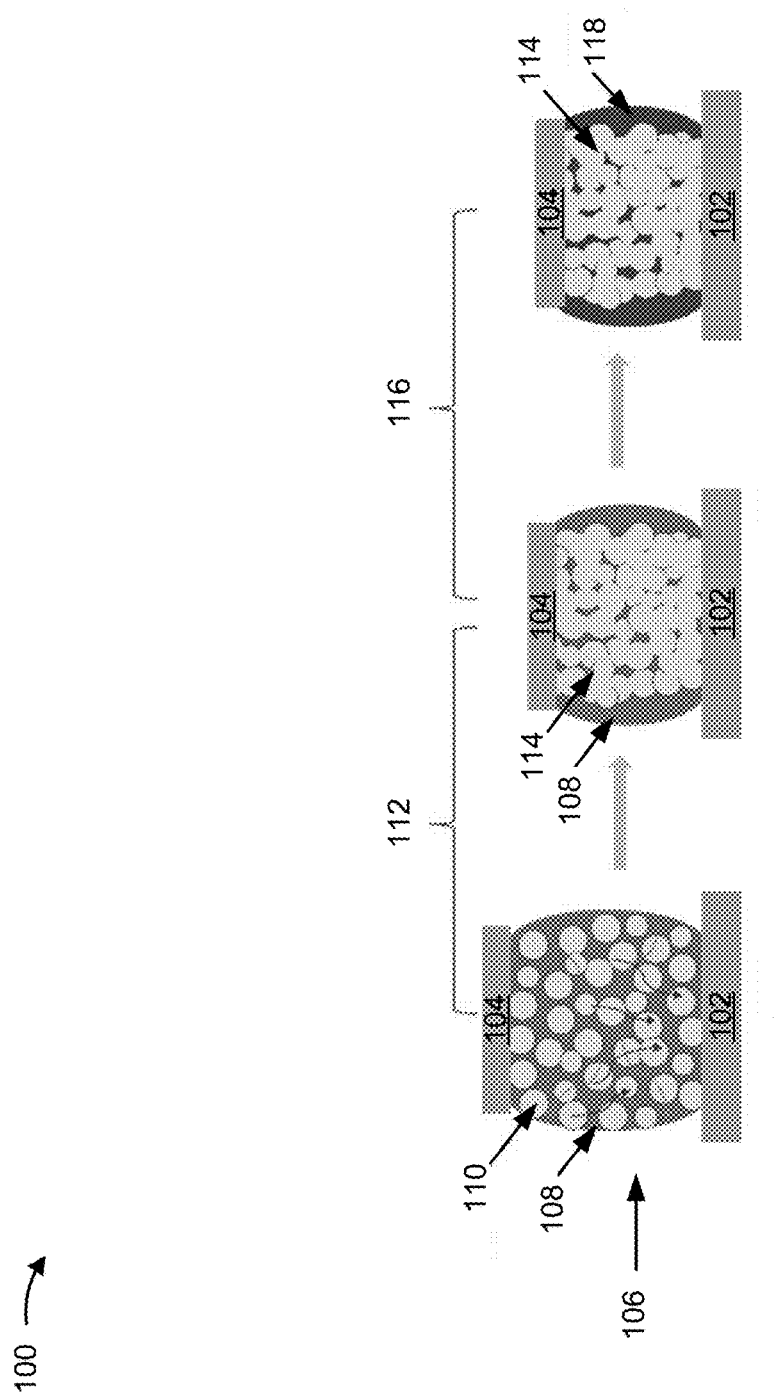
FIG. 1 is a diagram of an example implementation of a method and material for attaching a chip to a submount described herein.

The following detailed description of example implementations refers to the accompanying drawings. The same reference numbers in different drawings may identify the same or similar elements.

Silver-based pastes may be used as DA materials for mounting chips on submounts. However, silver-based pastes are prone to corrosion, functional deterioration, and/or failure, particularly when exposed to moisture and/or corrosive gases (e.g., hydrogen sulfide ($H_2S$), sulfur vapor, and/or the like). For example, silver in a DA material may corrode to form silver sulfide ($Ag_2S$), which may migrate along and tarnish the submount. Furthermore, silver sulfide may increase resistance and produce more heat in the DA material and the chip. Additionally, the heat and the silver sulfide may initiate and stimulate the growth of whiskers, which may lead to short circuits.

Some techniques include sealing a chip on a submount into a hermetic or semi-hermetic cavity package to protect silver in a DA material against corrosion. However, use of a cavity package causes an increase in total package size, which may not be suitable for applications having stringent requirements with regard to package size (e.g., automotive applications, aerospace applications, sensor applications, and/or the like).

Some techniques use overmolding materials, such as silicone or epoxy, directly on a chip on a submount to provide protection against corrosion of DA materials. However, adding overmolding materials may result in additional process steps and increased material costs. Furthermore, when applied directly on top of optical chips (e.g., lasers, photodiodes, and/or the like), overmolding materials may be exposed to light passing through them to/from the optical chip. As a result, such materials may degrade from absorption of the light and/or heat generated by the light. This degradation may interfere with the performance of the optical chip.

Some implementations described herein provide a method and a material for attaching a chip to a submount. The material may include silver particles within a UV curable resin. After applying the material to a submount and/or a chip and placing the chip on the submount, the material may be heated to sinter the silver particles. The sintered silver particles may attach the chip to the submount and may act as a heat conduction path (e.g., the sintered silver particles may dissipate heat from the chip to the submount and/or the like). As the silver particles sinter together, the UV curable resin may be pushed to an exterior surface of the material (e.g., due to a density of the silver particles being higher than a density of the UV curable resin, a flowability of the UV curable resin, and/or the like). The UV curable resin may then be cured using UV light to form a polymer on the sintered silver particles. The polymer may protect the sintered silver from corrosion, deterioration, and/or the like when exposed to moisture and/or corrosive gases. In this way, the method and material may protect the sintered silver without increasing package size, increasing material costs, or increasing complexity of manufacturing.

FIG. 1 is a diagram of an example implementation 100 of a method and material for attaching a chip to a submount described herein. As shown in FIG. 1, the example implementation 100 may initially include a submount 102, a chip 104, a DA material 106, a UV curable resin 108, and silver particles 110.

In some implementations, the submount 102 and the chip 104 may be components of a device. For example, the submount 102 may position the chip 104 within the device, and the chip 104 may include an optical device (e.g., an optical subassembly, a light detection and ranging (LIDAR) subassembly, a laser component, a vertical cavity surface emitting laser (VCSEL), and/or the like), an integrated circuit (e.g., a microprocessor, memory, an amplifier, an oscillator, and/or the like), a semiconductor component, and/or the like. In some implementations, the DA material 106 may be applied to the submount 102 and/or the chip 104, and the chip 104 may be positioned on the submount 102 such that at least a portion of the DA material 106 is positioned between the submount 102 and the chip 104.

As shown in FIG. 1, the DA material 106 may include the UV curable resin 108 and the silver particles 110. In some implementations, the silver particles 110 may be positioned within the UV curable resin 108.

In some implementations, a ratio, by weight, of the UV curable resin 108 to the silver particles 110 may be in a range from 0.05 to 1 (e.g. a ratio of between 0.05 and 1, inclusive). In some implementations, a ratio, by weight, of the UV curable resin 108 to the silver particles 110 in a range from 0.05 to 1 may improve sintering of the silver particles 110, may improve thermal coupling by the silver particles 110 between the submount 102 and the chip 104, may improve corrosion protection provided by the UV curable resin 108 to the silver particles 110, and/or the like as compared to ratios outside of the range from 0.05 to 1.

In some implementations, the ratio, by weight, of the UV curable resin 108 to the silver particles 110 may be higher for applications involving exposure to high levels of moisture and/or corrosive gases and lower for applications involving exposure to low levels of moisture and/or corrosive gases. For example, for an application in which the DA material 106 may be exposed to high levels of moisture and/or corrosive gases, the DA material 106 may include the UV curable resin 108 and the silver particles 110 at a ratio, by weight, of the UV curable resin 108 to the silver particles 110 in a range from 0.5 to 1. As another example, for an application in which the DA material 106 may be exposed to low levels of moisture and/or corrosive gases, the DA material 106 may include the UV curable resin 108 and the silver particles 110 at a ratio, by weight, of the UV curable resin 108 to the silver particles 110 in a range from 0.05 to 0.3.

In some implementations, the ratio, by weight, of the UV curable resin 108 to the silver particles 110 may be higher for applications involving a small chip 104 and lower for applications involving a large chip 104. For example, for an application in which the DA material 106 may attach a small chip 104, the DA material 106 may include the UV curable resin 108 and the silver particles 110 at a ratio, by weight, of the UV curable resin 108 to the silver particles 110 in a range from 0.4 to 1. As another example, for an application in which the DA material 106 may attach a large chip 104, the DA material 106 may include the UV curable resin 108 and the silver particles 110 at a ratio, by weight, of the UV curable resin 108 to the silver particles 110 in a range from 0.05 to 0.2. Additionally, or alternatively, the ratio, by weight, of the UV curable resin 108 to the silver particles 110 may be based on other parameters, such as a targeted bondline thickness, a type of UV curable resin 108, an environment in which a device including chip 104 and submount 102 may be used, and/or the like.

In some implementations, the UV curable resin 108 may include an epoxy-based resin, an acrylate-based resin, a silicone-based resin, and/or the like. In some implementations, UV curable resin 108 may include a filler. In some implementations, the UV curable resin 108 may have a density of 1.00 grams/centimeter$^3$.

In some implementations, the silver particles 110 may include microparticles, nanoparticles, and/or the like. In some implementations, the silver particles 110 may have a density of 10.49 grams/centimeter$^3$.

As shown in FIG. 1, the example implementation 100 may include a step 112 of heating the DA material 106 including the UV curable resin 108 and the silver particles 110. In some implementations, the step 112 of heating the DA material 106 may include heating the DA material 106 to a temperature in a range from 180° C. to 300° C. In some implementations, during the step 112 of heating the DA material 106, the silver particles 110 may fuse together and may form a silver joint (e.g., having a melting point of 961° C.).

In some implementations, step 112 may include heating the DA material 106 by sintering the silver particles 110 within the UV curable resin 108 to obtain the UV curable resin 108 on sintered silver particles 114. For example, and as shown on the left of FIG. 1, heating the silver particles 110 within the UV curable resin 108 may cause the silver particles 110 to sinter together, and the sintering of the silver particles 110 may push the UV curable resin 108 toward an exterior surface of the DA material 106 (e.g., a surface of the DA material 106 that may be exposed to moisture and/or corrosive gases, a surface of the DA material 106 that is not in contact with the submount 102 and/or the chip 104, and/or the like). For example, and as shown in the center of FIG. 1, the silver particles 110 have been sintered together to form the sintered silver particles 114, and at least a portion of the UV curable resin 108 has been pushed toward the exterior surface of the DA material 106 (e.g., due to a density of the silver particles being higher than a density of the UV curable resin, a flowability of the UV curable resin, and/or the like).

In some implementations, a volume of the DA material 106 is reduced when the silver particles 110 are sintered together to form the sintered silver particles 114. For example, and as shown by comparing the left portion of FIG. 1 to the center portion of FIG. 1, a spacing between the silver particles 110 before sintering may be reduced as the silver particles 110 are sintered together to form the sintered silver particles 114.

In some implementations, the sintered silver particles 114 may attach the chip 104 to the submount 102 and/or dissipate heat from the chip 104 to the submount 102. For example, the sintered silver particles 114 may have a thermal conductivity of greater than 100 Watts per meter-Kelvin (W/(m·K)).

As shown in FIG. 1, the example implementation 100 may include a step 116 of irradiating, with UV light, the UV curable resin 108 on the sintered silver particles 114 to obtain a polymer 118 on the sintered silver particles 114. In some implementations, irradiating the UV curable resin 108 with UV light may cause polymerization of the UV curable resin 108 by creating polymer crosslinks to form the polymer 118 on the sintered silver particles 114.

In some implementations, irradiating the UV curable resin 108 may include irradiating the UV curable resin 108 for a continuous exposure period, irradiating the UV curable resin 108 with pulses of UV light, and/or the like. In some implementations, example implementation 100 may include, before irradiating the UV curable resin, cooling the UV curable resin 108 on the sintered silver particles 114. Additionally, or alternatively, example implementation 100 may include heating the polymer 118 (e.g., to further cure the polymer 118 and/or the like).

As shown in FIG. 1, the polymer 118 may form a layer on the sintered silver particles 114. For example, because a portion of the UV curable resin 108 may be pushed toward the exterior surface of the DA material 106 when the silver particles 110 are sintered, the portion of the UV curable resin 108 on the exterior surface of the DA material 106 may, after being irradiated, become a portion of the polymer 118 forming the layer on the sintered silver particles 114. In some implementations, the sintered silver particles 114 may have exterior surfaces (e.g., a surface of the sintered silver particles 114 that may be exposed to moisture and/or corrosive gases, a surface of the sintered silver particles 114 that is not in contact with the submount 102 and/or the chip 104, and/or the like), and the polymer 118 may cover the exterior surfaces of the sintered silver particles 114 (e.g., by forming the layer and/or the like).

In some implementations, the layer may have a thickness in a range from 0.1 microns to 10 microns. In some implementations, the ratio, by weight, of the UV curable resin 108 to the silver particles 110 in the DA material 106 may be selected to form a layer of polymer 118 on the sintered silver particles 114, where the layer has a thickness in a range from 0.1 microns to 10 microns.

In some implementations, the polymer 118 may be an epoxy-based polymer, an acrylate-based polymer, a silicone-based polymer, and/or the like (e.g., depending on whether the UV curable resin 108 is an epoxy-based resin, an acrylate-based resin, a silicone-based resin, and/or the like). In some implementations, when the UV curable resin 108 is an epoxy-based resin, the ratio, by weight, of the UV curable resin 108 to the silver particles 110 in the DA material 106 may be lower than the ratio, by weight, of the UV curable resin 108 to the silver particles 110 in the DA material 106 when the UV curable resin 108 is an acrylate-based polymer. For example, an epoxy-based polymer may include fewer voids than an acrylate-based polymer, and, therefore, a thinner layer of epoxy-based polymer may provide similar protection, to the sintered silver particles 114, from moisture and/or corrosive gases as a thicker layer of acrylate-based polymer. Accordingly, the ratio, by weight, of the epoxy-based resin to the silver particles 110 in the DA material 106 may be lower than the ratio, by weight, of the acrylate-based resin to the silver particles 110 in the DA material 106.

As indicated above, FIG. 1 is provided merely as an example. Other examples may differ from what is described with regard to FIG. 1.

Figure 2:
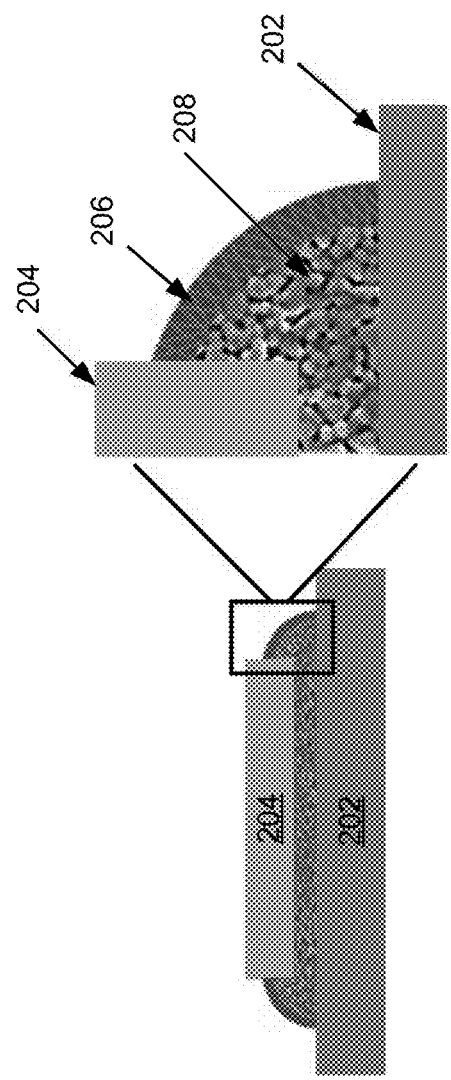
FIG. 2 is a diagram of an example implementation of a material attaching a chip to a submount described herein.

FIG. 2 is a diagram of an example implementation 200 of a material attaching a chip to a submount described herein. As shown in FIG. 2, the example implementation 200 includes a submount 202, a chip 204, a polymer 206, and sintered silver particles 208. The right side of FIG. 2 is a close-up view of the portion of the left side of FIG. 2 identified by a rectangular box.

In some implementations, the submount 202, the chip 204, the polymer 206, and the sintered silver particles 208 of FIG. 2 may be similar to the submount 102, the chip 104, the polymer 118, and the sintered silver particles 114 described herein with respect to FIG. 1. For example, the polymer 206 and the sintered silver particles 208 may be formed by a two-step process performed on a DA material applied to the submount 102 and/or the chip 104, where the DA material includes a UV curable resin and silver particles. In a first step, the DA material may be heated to form the sintered silver particles 208, and, in a second step, the UV curable resin may be cured (e.g., by UV light irradiation and/or the like) to form the polymer 206.

In some implementations, the sintered silver particles 208 may attach the chip 204 to the submount 202 and/or dissipate heat from the chip 204 to the submount 202. For example, and as shown in FIG. 2, the sintered silver particles 208 may be attached to an upper surface of the submount 202, a bottom surface of the chip 204, a portion of one or more side surfaces of the chip 204, and/or the like. As also shown in FIG. 2, the sintered silver particles 208 may have one or more exterior surfaces (e.g., one or more surfaces of the sintered silver particles 208 that may be exposed to moisture and/or corrosive gases, one or more surfaces of the sintered silver particles 208 that are not in contact with the submount 202 and/or the chip 204, and/or the like).

In some implementations, and as shown in FIG. 2, the polymer 206 may form a layer on the one or more exterior surfaces of the sintered silver particles 208. For example, the layer may have a thickness in a range from 0.1 microns to 10 microns. Additionally, or alternatively, and as shown in FIG. 2, the polymer 206 may attach to a portion of one or more side surfaces of the chip 204 and the upper surface of the submount 202, which may increase a durability of the attachment of the chip 204 to the submount 202. In this way, the polymer 206 may protect the sintered silver particles 208 (e.g., from moisture, corrosive gases, impacts, and/or the like) without increasing package size, increasing material costs, or increasing complexity of manufacturing.

As indicated above, FIG. 2 is provided merely as an example. Other examples may differ from what is described with regard to FIG. 2.

Figure 3:
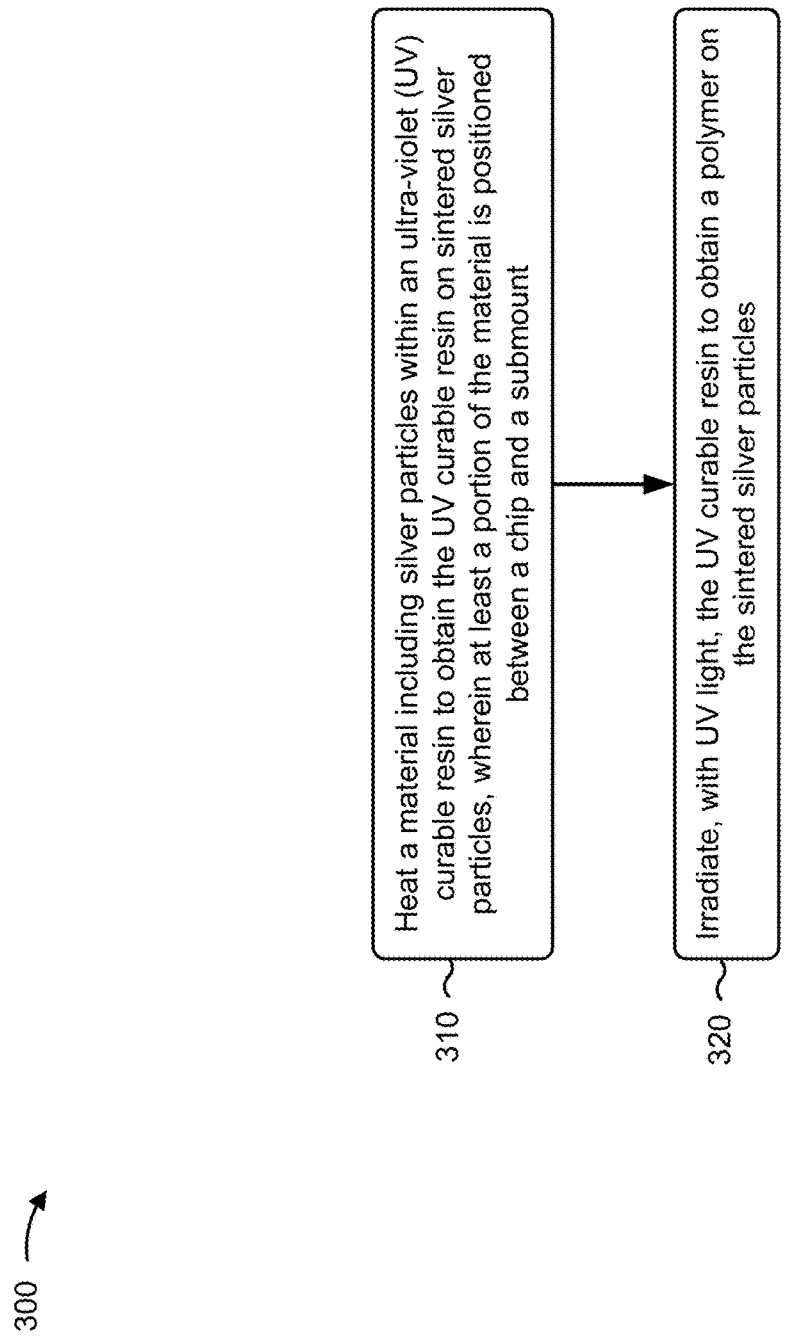
FIG. 3 is a flowchart of an example process for attaching a chip to a submount.

FIG. 3 is a flow chart of an example process 300 for attaching a chip to a submount. In some implementations, one or more process blocks of FIG. 3 may be performed by a device (e.g., a device including a heat source (e.g., a convection oven, a heat lamp, a furnace, and/or the like) and a UV light source (e.g., a UV curing system, a UV lamp, and/or the like), such as a convection oven including a UV curing system). In some implementations, one or more process blocks of FIG. 3 may be performed by another device or a group of devices separate from or including the device, such as a convection oven and a separate UV curing system, and/or the like.

As shown in FIG. 3, process 300 may include heating a material including silver particles within an ultra-violet (UV) curable resin to obtain the UV curable resin on sintered silver particles, wherein at least a portion of the material is positioned between a chip and a submount (block 310). For example, a device may heat a material including silver particles within an ultra-violet (UV) curable resin to obtain the UV curable resin on sintered silver particles, as described above. In some implementations, at least a portion of the material is positioned between a chip and a submount.

As further shown in FIG. 3, process 300 may include irradiating, with UV light, the UV curable resin to obtain a polymer on the sintered silver particles (block 320). For example, the device may irradiate, with UV light, the UV curable resin to obtain a polymer on the sintered silver particles, as described above.

Process 300 may include additional implementations, such as any single implementation or any combination of implementations described below and/or in connection with one or more other processes described elsewhere herein.

In a first implementation, heating the material comprises heating the material to a temperature in a range from 180° C. to 300° C.

In a second implementation, alone or in combination with the first implementation, heating the material comprises sintering the silver particles within the UV curable resin, and sintering the silver particles within the UV curable resin pushes the UV curable resin toward an exterior surface of the material to obtain the UV curable resin on the sintered silver particles.

In a third implementation, alone or in combination with one or more of the first and second implementations, irradiating the UV curable resin comprises at least one of irradiating the UV curable resin for a continuous exposure period or irradiating the UV curable resin with pulses of UV light.

In a fourth implementation, alone or in combination with one or more of the first through third implementations, process 300 includes applying the material to at least one of the submount or the chip and positioning the chip on the submount.

In a fifth implementation, alone or in combination with one or more of the first through fourth implementations, process 300 includes, before irradiating the UV curable resin, cooling the UV curable resin on the sintered silver particles.

In a sixth implementation, alone or in combination with one or more of the first through fifth implementations, process 300 includes heating the polymer.

In a seventh implementation, alone or in combination with one or more of the first through sixth implementations, the polymer forms a layer on the sintered silver particles, and the layer has a thickness in a range from 0.1 microns to 10 microns.

Although FIG. 3 shows example blocks of process 300, in some implementations, process 300 may include additional blocks, fewer blocks, different blocks, or differently arranged blocks than those depicted in FIG. 3. Additionally, or alternatively, two or more of the blocks of process 300 may be performed in parallel.

As indicated above, FIGS. 1-3 are provided merely as examples. Other examples may differ from what is described with regard to FIGS. 1-3. For example, the DA material may include other particles, such as gold-tin (AuSn) particles, tin-lead particles, tin-silver-copper particles, tin-antimony particles, and/or other alloy particles, rather than or in addition to silver particles. Additionally, or alternatively, the DA material may include silver epoxy, other soldering pastes, and/or the like. In some implementations, the DA material may include one or more electronic beam (E-beam) curable materials rather than or in addition to the UV curable resin, where the E-beam curable materials may be cured by irradiation with an electron beam.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A device, comprising:
   a submount;
   a material including sintered silver particles within a polymer,
      wherein the polymer is formed by curing an ultra-violet (UV) curable resin on the sintered silver particles,
      wherein the sintered silver particles are sintered within the UV curable resin, and
      wherein a portion of the polymer forms a layer on an exterior surface of the sintered silver particles,
         the layer having a thickness between 0.1 and 10 microns; and
   a chip attached to the submount by the material,
      wherein the layer is connected to a portion of one or more side surfaces of the chip and a top surface of the submount.

2. The device of claim 1, wherein the chip comprises at least one of an optical device or an integrated circuit.

3. The device of claim 1, wherein the sintered silver particles have a density of 10.49 grams/centimeter$^3$, and
   wherein the UV curable resin has a density of 1.00 grams/centimeter$^3$.

4. The device of claim 1, wherein the sintered silver particles are formed from at least one of microparticles or nanoparticles.

5. The device of claim 1, wherein the UV curable resin comprises at least one of an epoxy-based resin, an acrylate-based resin, or a silicone-based resin.

6. The device of claim 1, wherein the UV curable resin comprises a filler.

7. The device of claim 1, wherein a ratio, by weight, of the UV curable resin to the sintered silver particles is in a range from 0.05 to 1.

8. A die attachment material, comprising:
   an ultra-violet (UV) curable resin; and
   silver particles to attach a chip to a submount,
      wherein the silver particles are un-sintered and positioned within the UV curable resin, and
      wherein a ratio, by weight, of the UV curable resin to the silver particles is between 0.05 and 1, and
      the ratio is selected such that, when cured, a layer of polymer on sintered silver particles has a thickness in a range from 0.1 microns to 10 microns.

9. The die attachment material of claim 8, wherein the silver particles have a density of 10.49 grams/centimeter$^3$, and
   wherein the UV curable resin has a density of 1.00 grams/centimeter$^3$.

10. The die attachment material of claim 8, wherein the silver particles comprise at least one of microparticles or nanoparticles.

11. The die attachment material of claim 8, wherein the UV curable resin comprises at least one of an epoxy-based resin, an acrylate-based resin, or a silicone-based resin.

12. The die attachment material of claim 8, wherein the UV curable resin comprises a filler.

13. A device, comprising:
a submount; and
a die attachment material,
   wherein the die attachment material includes a polymer comprising sintered silver particles within a cured ultra-violet (UV) curable resin,
   wherein the die attachment material attaches a chip to the submount, and
   wherein a layer of the polymer, consisting of the cured UV curable resin, has an exterior surface connecting a portion of one or more side surfaces of the chip to a top surface of the submount, the layer having a thickness in a range from 0.1 microns to 10 microns.

14. The device of claim 13, wherein the sintered silver particles have a density of 10.49 grams/centimeter$^3$, and
   wherein the UV curable resin has a density of 1.00 grams/centimeter$^3$.

15. The device of claim 13, wherein the sintered silver particles are formed from at least one of microparticles or nanoparticles.

16. The device of claim 13, wherein the UV curable resin comprises at least one of an epoxy-based resin, an acrylate-based resin, or a silicone-based resin.

17. The device of claim 13, wherein the UV curable resin comprises a filler.

18. The device of claim 13, wherein a ratio, by weight, of the UV curable resin to the sintered silver particles is in a range from 0.05 to 1.

* * * * *